Sept. 17, 1968 D. GOLDWARE 3,401,705

ETCHING EQUIPMENT

Filed Sept. 21, 1966 4 Sheets-Sheet 1

INVENTOR
DAVID GOLDWARE

BY Irvin C. Alter
ATTORNEY

INVENTOR
DAVID GOLDWARE

BY Irwin C. Alter
ATTORNEY

ETCHING EQUIPMENT

Filed Sept. 21, 1966 4 Sheets-Sheet 3

INVENTOR
DAVID GOLDWARE

BY Irwin C. Alter
ATTORNEY

INVENTOR
DAVID GOLDWARE

BY Irwin C. Alter
ATTORNEY

United States Patent Office 3,401,705
Patented Sept. 17, 1968

3,401,705

ETCHING EQUIPMENT

David Goldware, 3858 N. Cicero, Chicago, Ill. 60641

Filed Sept. 21, 1966, Ser. No. 580,996
21 Claims. (Cl. 134—57)

This invention relates to etching equipment and more particularly to automatic, high precision etching equipment for use in fabricating printed circuit boards.

The etching of printed circuit boards is complicated by either or both the exothermic nature of the etchant and the noxious gases released by the etchant. The excess heat and noxious atmosphere created by the etchants is generally overcome by expensive venting processes and equipment.

In addition to the adverse ambient conditions which are inherently caused by the etchants, the manner generally used in applying the etchant is inefficient in that it causes defects in the final printed circuit board, such as those referred to as undercutting and patterning. These defects are, of course, even more apparent when high precision fine line etching is desired.

Accordingly, it is an object of the present invention to provide a new and novel automatic etching machine.

A further object of the invention is to provide automatic etching equipment capable of consistently providing "fine line" printed circuit boards. The inventive equipment automatically removes the boards undergoing etching from contact with the etchant and exposes the board to air to enable sufficient cooling to counteract the effects of exothermic etchants that may be used.

Another object of the invention is to provide means for gently spraying the etchant onto the workpieces with a great degree of uniformity so that all parts of the workpiece are covered wih the etchant in a manner designed to eliminate undercutting and patterning.

Another object of the invention is to provide equipment that automatically moves the boards to be etched through an etchant applicator while maintaining proper temperatures. When the etching cycle is completed the equipment is automatically turned off.

Yet another object of the invention is to provide signalling means for indicating the completion of a work cycle. Still another object of the invention is to provide means for readily inspecting the workpieces.

In accordance with a preferred embodiment of the invention, automatic etching equipment is provided which comprises a tank or enclosure containing the proper etchant. Only the bottom of the tank contains the etchant liquid. The top part of the tank has means for directing a soft, even spray of etchant at the workpiece. Chain assembly means including a unique outwardly biased clamp is provided and immersing the workpiece into the spray and retrieving it therefrom. The clamp is used to join the workpiece to the chain assembly. The workpiece is then automatically lowered into the tank. The workpiece is automatically continuously immersed and withdrawn from contact with the etchant spray. While it is so removed, the workpiece has an opportunity to cool. Thus, etchants that are highly exothermic but do not release noxious fumes can be utilized. The workpiece continues to be cycled by the chain assembly until a set time period has expired. Then the workpiece is completely removed from the etching application equipment and the chain assembly then stops automatically. The chain assembly is adjustable to assure that the workpiece hangs in a perpendicular manner to prevent undercutting and patterning.

The above mentioned and other objects and features of the invention and the manner for obtaining them will become more apparent, and the invention itself will be best understood by reference to the following description of an embodiment of the invention taken in conjunction with the accompanying drawings, in which.

Figures 1, 2:
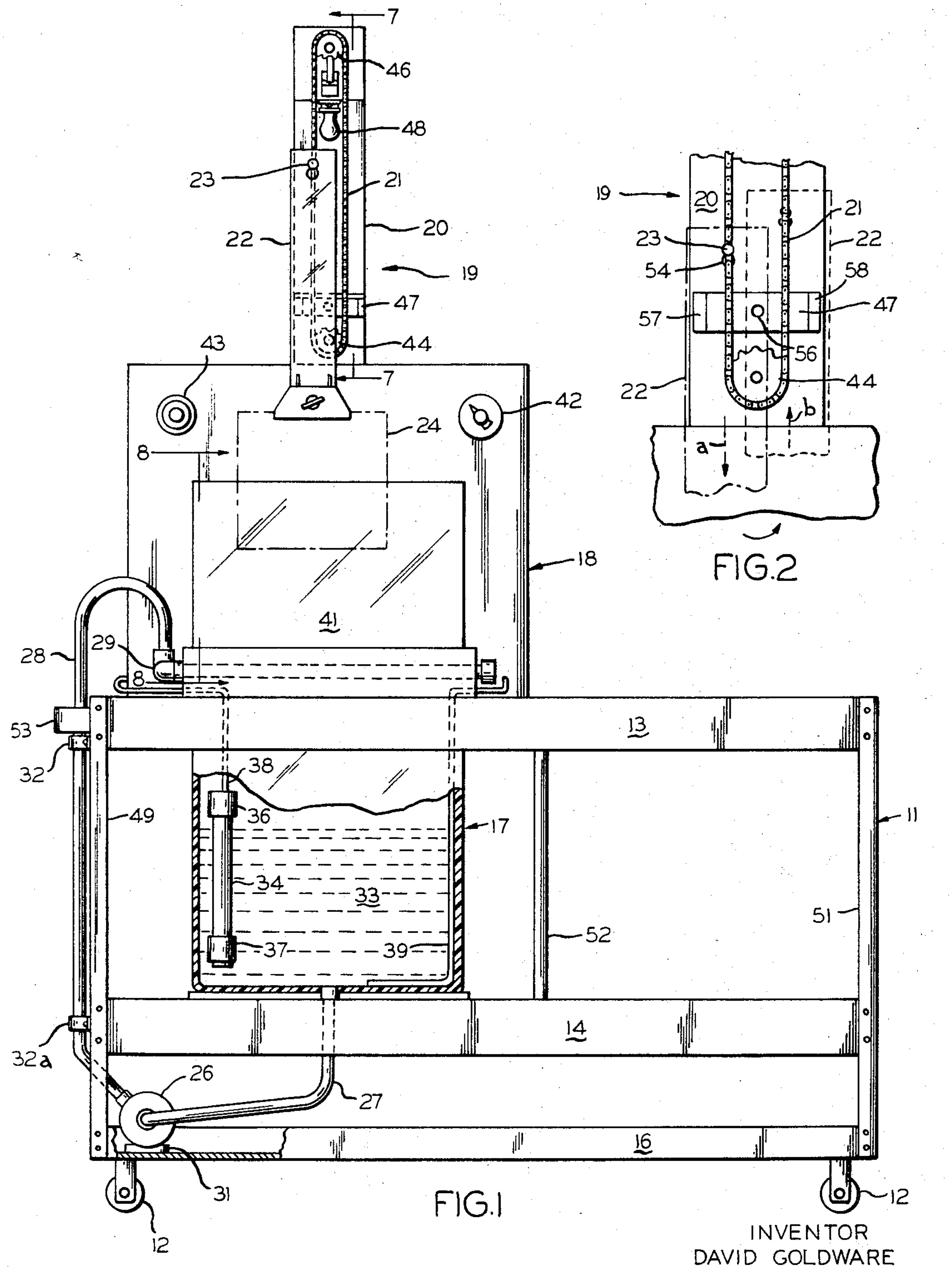
FIG. 1 is a front view of the inventive automatic etching equipment showing a cross sectional view of the etching tank.
FIG. 2 shows details of the bottom portion of the chain and sprocket assembly with the hanger and clamp shown in dotted lines.
Figures 7, 8, 9, 10:
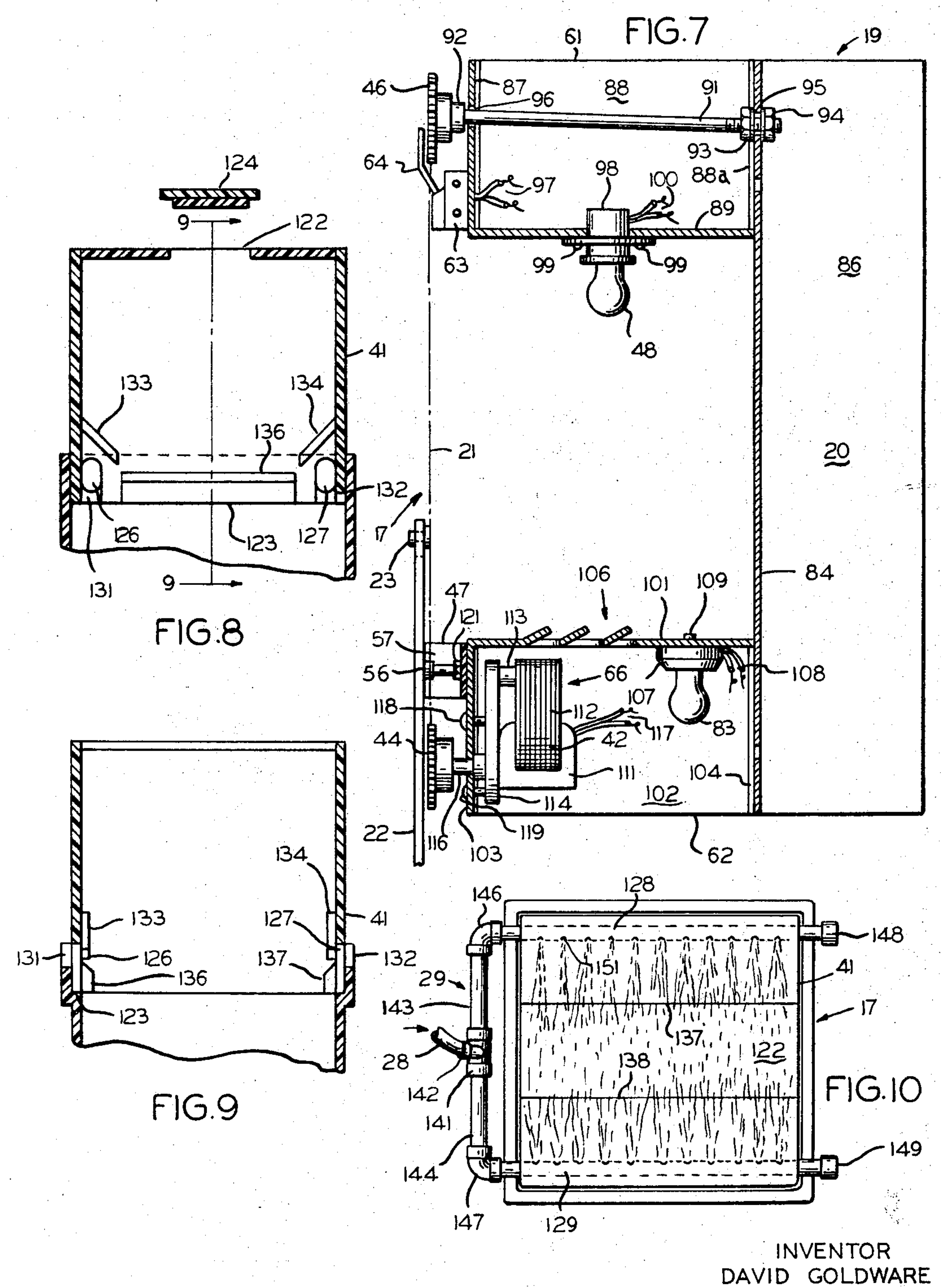
FIG. 7 is a cross sectional view of the chain drive assembly taken along a plane passing through line 7—7 of FIG. 1.

FIGS. 8 and 9 are sectional views of the splash housing which fits over the tank taken along lines 8—8 and 9—9 respectively, in FIGS. 1 and 8 respectively.

Figure 11:
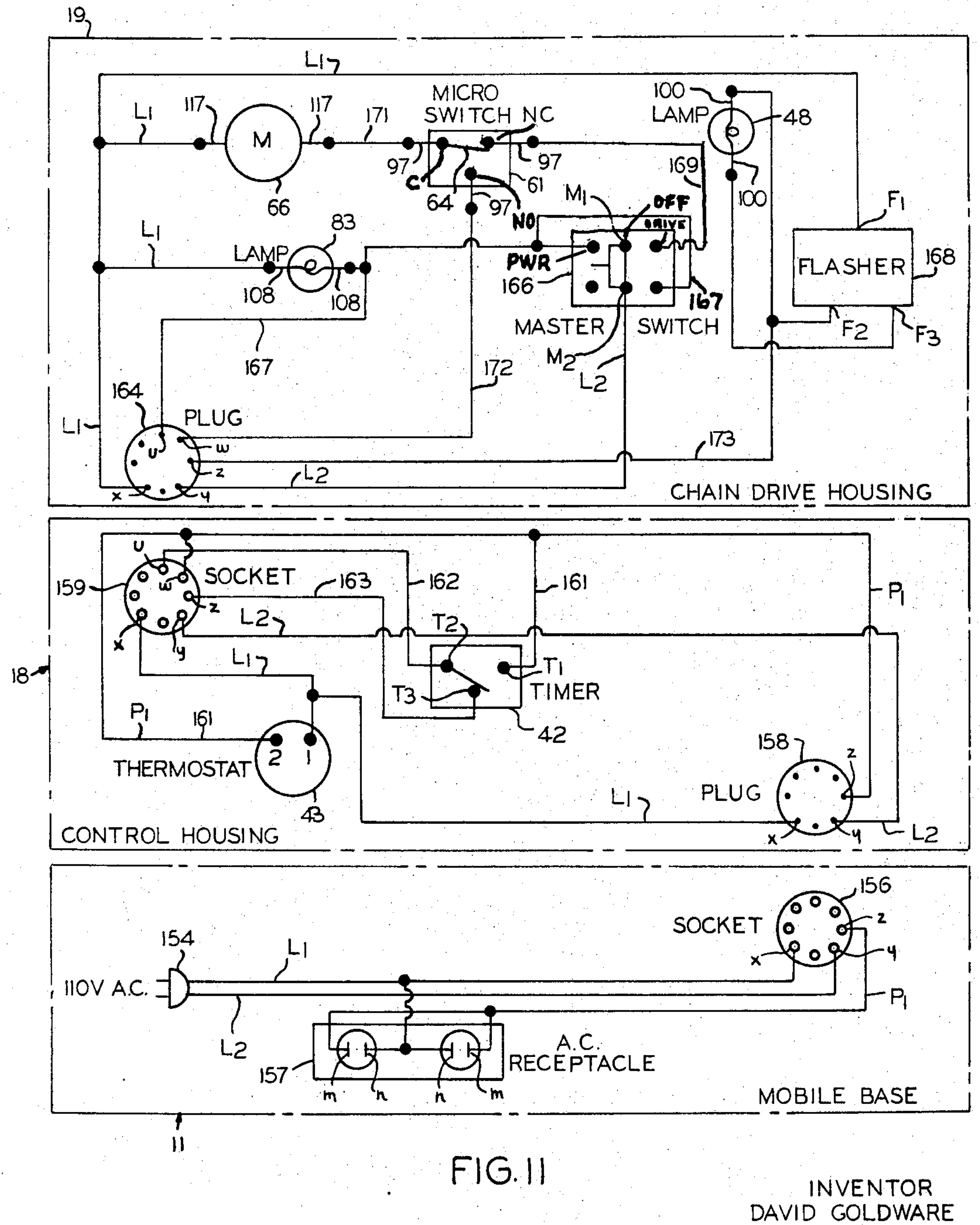

FIG. 10 is a top view of the tank with the splash housing removed showing the layout of the spray pipes; and FIG. 11 is a wiring diagram of the inventive automatic etching equipment.

Turning now to FIG. 1, a complete front view assembly of the inventive etching equipment is shown. The equipment is shown mounted on a mobile base or cart 11 which may be equipped with casters 12.

The cart is shown having a plurality of shelves, such as top shelf 13, middle shelf 14 and bottom shelf 16. The top shelf 13 has a slot 15 therein through which a tank assembly 17 extends.

The tank assembly rests on the middle shelf 14. The top shelf 13 supports control housing 18. A chain drive assembly or drive housing 19 is coupled to and supported by the control housing. The chain drive assembly has a vertical section 20 which contains a chain driving mechanism and ancillary equipment. The workpiece is attached to a chain 21 of chain assembly 19 using hanger and clamp assembly 22 and drive chain dog 23. The workpiece 24 is shown in dotted line form.

The bottom shelf of the mobile base 11 contains a pump 26 which is attached through tubing 27 to the bottom of tank assembly 17. The outlet of the pump 26 is connected through tubing 28 to spray assembly 29 designed to completely flush the workpiece with a gentle, even spray of etchant. The pump is shown supported on the bottom shelf 16 by means, such as shock absorbing padding 31. The tubing 28 is also shown supported by supports 32, **32*a***.

The cross sectional view of the tank 17 in FIG. 1 shows that the tank is partially filled with the etchant liquid 33. Also visible in the FIG. 1 view of the tank is a heater 34 for bringing the etchant up to proper operating temperature. The heater is shown disposed at the sides of the tank and supported by bottom and top supports 36, 37 respectively. A cable 38 delivers power to the heater 34 from control panel 18.

Means, such as heat sensor 39, are used to determine when the etchant temperature has risen to the operating point. The sensor 39 is coupled to controls in panel 18. The controls automatically turn on and off the heater to maintain the critical operating temperature.

The tank is capped by cover or splash housing 41 which reduces the possibility of contaminant being introduced to the workpiece during the spraying operation. The cover 41 also keeps the spray from splashing over the work area.

The control housing 18 is equipped with the necessary means for controlling the etching operation. Typical exemplary controls shown in FIG. 1, are timer switch 42 used to control the length of time devoted to the etching operation by the automatic equipment of FIG. 1. Also shown is control knob 43 which may be a thermostat for controlling the operating temperature of the etchant 33.

The chain drive housing assembly 19 as shown in FIG. 1, comprises chain 21 mounted between chain drive sprocket 44 and idler sprocket 46. A drive chain dog, such as dog 23, is provided for attaching the hanger and clamp assembly 22 to the chain. A hanger guide 47 is provided for guiding the hanger and clamp assembly 22 as the hanger is cycled by the movement of chain 21.

Means, such as wink light 48, are provided toward the top of the chain drive assembly 19. The wink light 48 serves to signal that the workpiece has undergone a complete etching operation. When the complete operation is over the wink light continually flashes on and off.

The shelves of mobile base 11 are supported by standards 49, 51 normally found on carts of the same type. An extra shelf support standard 52 may be provided to assure the rigidity of both shelves 13 and 64 during the operation of the equipment. A handle 53 is provided to control the movement of the cart 11.

Some details of the chain drive assembly 19 are shown in FIG. 2. The hanger 22 is shown traveling down as indicated by arrow *a*, and traveling up as indicated by arrow *b*. The movement of the hanger is, of course, dependent on the movement of chain 21 about drive sprocket 44. The hanger is shown by a dottel line at *a* and by dot-dash lines at *b* for purposes of clarity and explanation. As can be best seen in FIG. 2, the hanger has a slotted hole 54 for conveniently hanging the hanger assembly 22 on dog 23. The guide 47 is coupled to drive chain assembly support 20 by any well known fastening means, such as fastener 56. Guide 47 is U-shaped and has two extended arms 57, 58 which frictionally engage the hanger as it moves down and up respectively. The guide steadies the hanger and dampens any tendency for the hanger and attached workpiece to sway as it goes through the spray.

Figures 3, 4, 5, 6:
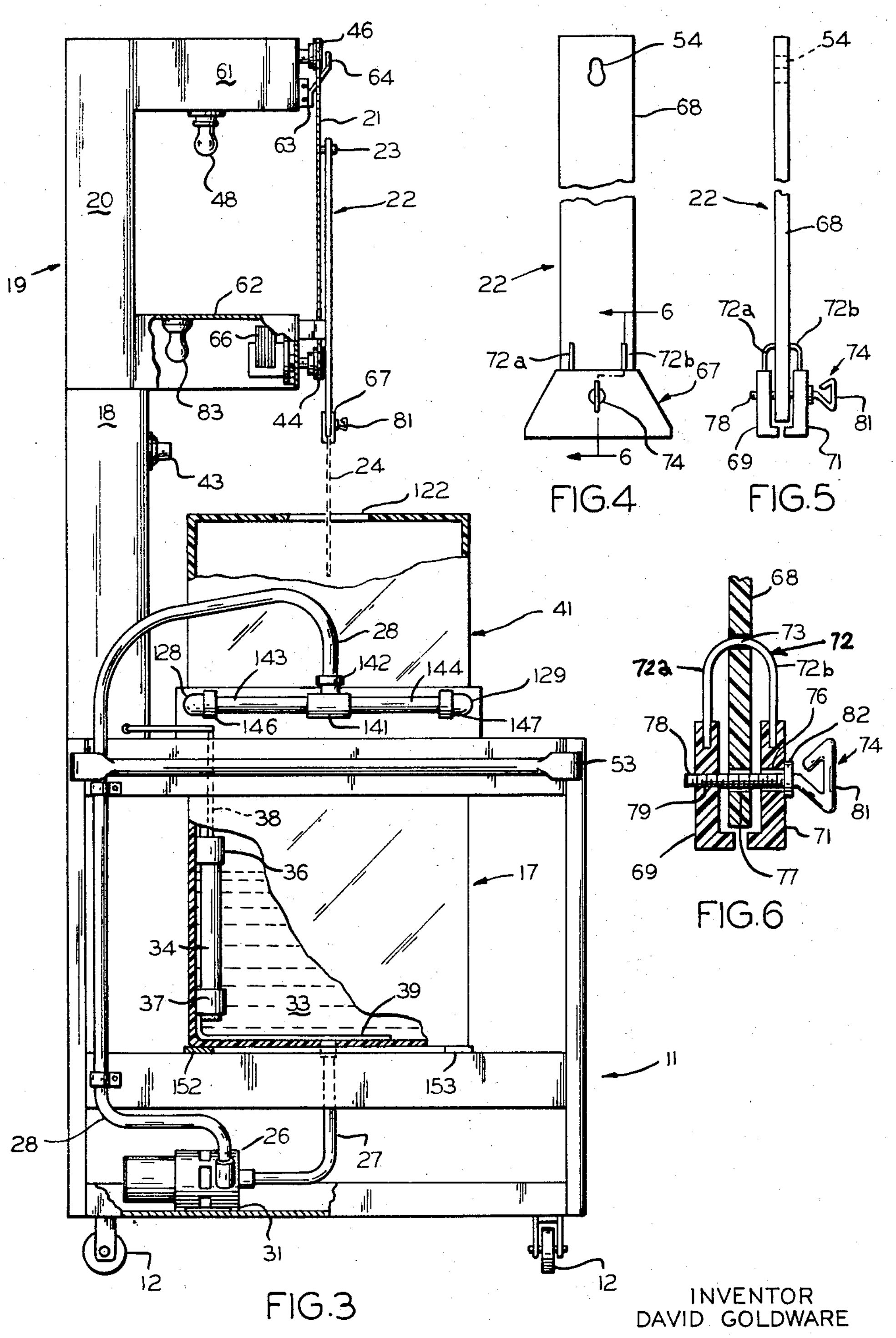
FIG. 3 is a side view of the inventive automatic etching equipment of FIG. 1 with details of the tank and supporting assemblies shown in cross sectional views.
FIGS. 4 and 5 are front and side views respectively, of the hanger and clamp assembly used for holding the workpiece.
FIG. 6 is a cross sectional view of the actual outwardly biased clamp taken along line 6—6 of FIG. 4.

FIG. 3 shows the side view of the assembled automatic equipment. The same designation numbers are used wherever applicable for the sake of brevity and clarity of description. As can be readily discerned, the equipment is viewed from the handle 53 side of mobile base 11. Among other things, FIG. 3 shows some of the details of the chain drive housing assembly 19. The assembly has a top extension or porch 61 and a bottom extension or porch 62. The porches extend a sufficient distance to support the chain drive so that the supported workpiece is over the middle of the tank 17. The top sprocket 46 is rotatably supported on the end of porch 61.

Means are provided for automatically turning off the equipment. More particularly, microswitch 63 is mounted on top porch 61. Microswitch 63 has actuating lever 64 extending to the front of the chain 21 so that when the workpiece reaches the top of the chain drive at sprocket 46, the workpiece pushes against the lever 64 and the microswitch is operated to stop the operation of the equipment under certain conditions.

The chain extends between top idler sprocket 46 and drive sprocket 44.

A section of bottom porch 62 is shown broken away to reveal motor 66 used to power the drive sprocket 44.

The side view of FIG. 3 shows to advantage the hanger clamp 22 coupled to the chain 21 with chain dog 22. The workpiece 24 is clamped on the unque outwardly biased clamp portion 67 of the hanger clamp 22.

The hanger clamp assembly 22 is shown in detail in FIGS. 4, 5 and 6. The slotted hole 54 is located near the top of the hanger section 68 of hanger clamp assembly 22. The clamp section is designed to conveniently grasp the workpiece. The outwardly biased clamp 67, as best seen in FIGS. 5 and 6, comprises jaws 69, 71. The jaws 69, 71 are L-shaped and reverse L-shaped respectively.

Resilient means, such as the arcuate springs 72*a*, 72*b* are provided for joining and outwardly biasing the jaws 69, 71. The middle top section 73 of spring 72 is firmly fixed in hanger section 68. The method of firmly fixing the spring 72 into section 68 is not important. For example, it may be press-fitted into section 68 or section 68 may be molded with spring 72 in place. The spring 72 is also firmly fixed into the tops of the vertical sections of jaws 69, 71.

The normal inclination of the springs 72*a*, 72*b* is to extend horizontally on both sides of spring section 73. Means are provided for overcoming this natural tendency. In the preferred embodiment of the drawings, clamp bolt 74 is used to provide the force to overcome the outward biasing force of the springs 72*a*, 72*b* tending to cause the springs to extend horizontally. More particularly, the clamping bolt extends through holes 76, 77 in jaw 71 and hanger 68 respectively. The diameters of the holes 76, 77 are larger than the outer diameter of screw thread section 78 of bolt 74 so that the bolt readily slips through the holes 76, 77.

A threaded hole 79 is provided in the jaw 69 which is opposite the handle 81 of clamp bolt 74. In addition, the clamp bolt 74 is provided with a shoulder 82 having a diameter larger than the diameter of hole 76. The shoulder 82 is located between the handle 81 and the threaded portion 78 of the clamp bolt 74. The handle 81 is shown somewhat triangular in shape. It should be understood that this showing is only by way of example to show a shape which makes manipulating the clamp bolt simple. For example, the handle could readily be a larger diameter knurled cylindrical section.

The clamp bolt 81 is inserted through holes 76, 77 and threaded into hole 79 until shoulder section 82 abuts the outer wall of the vertical section of clamp jaw 71. The workpiece is slipped between the horizontally extending sections of the jaws, then the clamp bolt is turned to thread it deeper into threaded hole 79. This exerts inward forces on the jaws and causes the threads and shoulder to force the clamp jaws closer together against the spring forces. The clamp jaws abut against the workpiece and securely hold it to the hanger.

The workpiece is easily removed. The clamp bolt is merely turned in a direction unscrewing it from the threaded hole 70. Due to the outward bias, the spring forces immediately separate the jaws 69, 71 thereby releasing the workpiece. Thus, the hanger clamp assembly 22 offers a conveinent and extremely efficient way of securing the workpiece so as to guide and control it through the etching cycle.

Returning to FIG. 3, therein is shown the location of the means for signalling the end of a cycle. More particularly, the wink light 48 is shown mounted dependent from the middle of the top porch 61. The operation of microswitch 63 to stop the chain drive motor 66 causes the wink light to be intermittently energized. The flashing of the wink light signals the end of the etching operation.

Means are provided for illuminating the workpiece for inspection purposes. More particularly, as shown in FIG. 3, at the cut-out portion of bottom porch 62, an inspection light 83 is provided.

As the workpiece is carried to its highest position by the hanger clamp, it is directly in the rays of the inspection light 83. While the workpiece is so illuminated, the printed circuit board is rendered translucent. The operator can thus readily observe the workpiece and determine if all the excess copper has been etched away and if the lines are properly developed.

The drive chain assembly 19 is shown in greater detail in FIG. 7, which is a cross sectional view of assembly 19 taken from a plane intersecting the assembly along line 7—7 of FIG. 1, looking in the direction of the arrows. The vertical section of chain drive housing 19 is hollow, comprising a front panel 84 and two symmetrical side panels, such as side panel 86. A rear panel could also be provided.

The top and bottom porches 61, 62 are also shown as hollow sections. For example, top porch has a front panel 87, side panels, such as side panel 88, and a floor section 89. The panels and floor sections may be fabricated from separate pieces and attached together in any well known manner, or the porches may be fabricated from one integral piece. As shown herein, panel 87 and floor 89 are fabricated from one piece. The panels, such as panel 88, are bent over at **88*a*, and attached to panels 84 and 87. In any case, the porches are attached to wall 84 of vertical section 20** in any well known manner.

The top porch 61 contains the assembly for holding and adjusting sprocket 46. More particularly, the sprocket 46 is rotatably fastened to bar 91 with collar 82. The bar extends through walls 84 and 87. The end that extends through panel 87 is threaded. Two nuts 93, 94, one on either side of panel 84, fixedly attach the bar 91 to panel 87 where it extends through hole 95 in the panel. The other end of bar 91 extends through hole 96 in panel 87.

The hole 96 is shown slightly higher than hole 95. The inclination, as well as the tautness of the chain, is thus easily adjusted by varying the position of the sprocket wheel 46 on bar 91 and by varying the extended length of bar 91. This is accomplished by moving nuts 94, 95.

The collar 92 may include a bearing assembly (not shown). The bearing assembly would enable sprocket wheel 46 to rotate about its axis with a minimum of friction.

The microswitch 63 is shown attached to panel 87. Actuating lever 64 fits in front of sprocket wheel 46 where it is certain to be operated by the pressure applied to the lever 64 when the hanger clamp 22 is carried toward the top in the chain's cycle. Wire leads 97 are connected in series between a source of power and the equipment controlled by the switch 63.

A socket 98 is shown inserted through the middle of floor 89. The socket contains wink light 48 and is mounted to the floor 89 using any well known fasteners, such as by using sheet metal screws 99. The wink light is energized when power is connected to leads 100.

The bottom porch 62 comprises roof section 101, side panels, such as panel 102 and front wall 103. As was noted with regard to porch 61, the bottom porch 62 is attached to the vertical section 20 front wall 84 in any well known manner. For example, the folded over section 104 of wall 102 could be welded to wall 84.

Roof section 101 contains louvers 106 for assuring adequate ventilation for motor 66 and inspection light 83. The inspection light is connected to power through socket 107 and associated leads 108. The socket is mounted on roof section 101 in any well known manner, such as is with threaded fastener 109. There is no floor so that the light rays of the inspection light are unimpeded.

Motor 66 is shown as a typical synchronous motor having coil 111 surrounding laminated stator 112. The stator surrounds a rotor 113, which extends into gear box 114. Drive axis 116 extends from the gear box through front wall 103. Drive sprocket 44 is fixedly connected to drive axis 103 so that sprocket 44 rotates responsive to the rotation of axis 116. The motor is energized through leads 117 leading to coil 111. The motor 66 is mounted on front panel 103 by any well known means, such as fasteners 118, 119.

The chain 21 extends from sprocket 44 to sprocket 46. The hanger clamp assembly 22 is coupled to the chain by drive chain dog 23. FIG. 7 shows how the guide 47 assures, among other things, that the hanger-clamp and workpiece will not become entangled in the drive chain. The U-shaped guide 47 is mounted to the wall 103 using fastener 56. The fastener 56 actually serves a dual purpose. It not only fastens the guide 47 to wall 103, but it also provides an additional guiding source. More particularly, the top of fastener 56 is a flat surface. The hanger 22 rests against one extended arm, such as arm 57, and the top of fastener 56 on its downward journey, and against the top of fastener 56 and extended arm 58 during the upward traveling portion of the cycle. The distance between the top of fastener 56 and wall 103 can be readily adjusted so that the top thereof is in the same plane as the tops of extended arms 57, 58. The hanger is thus guided by two surfaces whether traveling up or down.

Returning to FIG. 3, there is shown the side view of control housing 18. The thermostat control knob 43 is at the top of the control housing so that it is rapidly accessible with the tank 17 in place.

A cut-away section of splash housing 41 shows slot 122 at the top thereof, which gives the workpiece access to the etchant application equipment. FIGS. 8 and 9 show details of the splash housing 41 and its contents. FIG. 8 is a cross sectional view of the housing without the pipes shown taken along a plane going through line 8—8 of FIG. 1 and viewed in the direction of the arrows. The housing can be made of a transparent plastic material, thus making the operation of the equipment more amenable to inspection.

The housing sets within the tank 17 on shoulder 123. A dust cover 124 is provided to protect the inside of the tank when the equipment is not in use. The cover 124 is shaped to fit into slot 122. Slots 126, 127 fit over inlet tubes or pipes 128, 129 of spray assembly 29. The pipes fit through the slots and are supported by the bottom of slots, such as the bottom of slots 131, 132 located in the wall of tank 17. Means, such as diverters 133, 134, protect the slots from drippings that may drain off the walls of housing 41.

Means are provided for guiding the workpiece. For example, guides, such as guide 136, are provided on opposite sides of housing 41 as best seen in FIG. 9. A similar guide 137 is provided on the opposite wall. One guide is in contiguous relationship with the workpiece during its downward travel. The other guide gently abuts the workpiece during its upward travel. The guides act to dampen an undue transverse travel on the part of the workpiece.

FIG. 9 is a cross sectional view of the splash housing 41 taken along line 9—9 of FIG. 8 and viewed in the direction of the arrows. The housing rests on shoulder of tank 17, such as shoulder 123. The top of the tank 17 has slots 131, 132 located therein. Slots 126, 127 of the housing coincide with the slots of the tank to form a passageway for pipes 128, 129 of the spray assembly 29. The passageways thus formed are guarded by diverters 133, 134 to prevent escape of etchant drippings which form on the walls of housing. Thus, the splash housing 41 provides passageways for the spray assembly 29, a slot to enable the workpiece to be exposed to the etchant and guides to dampen vibration or adverse transverse motion of the workpiece while it is being sprayed with the etchant. Of course, the housing prevents the loss of etchant because of splash.

FIG. 10 best shows the spray assembly 29 in the tank 17. The slot 122 of housing 41 is defined by edges 138, 137. The workpiece is lowered and raised through the gentle spray of etchant provided by the spray assembly.

The etchant is furnished to the spray assembly through tubing 28 from pump 26, as shown by the arrow. The tubing is attached to the vertical section of pipe T 141 with clamping means, such as strap clamp 142. The horizontal sections of pipe T 141 are attached through pipes 143, 144 to right angle elbows 146, 147 respectively. Pipe sections 128, 129 are attached to the elbows 146, 147 respectively. The ends of pipe 128, 129 terminate in caps 148, 149 respectively.

The pipe section 128, 129 have small orifices or holes 151 extending across the entire length of the pipes. The holes are drilled to provide a gentle uniform spray, normal to the workpiece. The pipe in a preferred embodiment of the invention was made of polyvinyl chloride. The uniformity of the spray gently falling on the workpiece and normal thereto eliminates patterning and minimizes undercutting.

Returning to FIG. 3, therein tubing 28 is shown connected to pump 26. The tubing 28 is clamped to mobile base 11 by means such as support clamps 32, **32*a*. The inlet to pump 26 is tubing 27 extending from the bottom of tank 17. The cutaway portion of shelf 16 shows the pump resting on resilient shock-absorbing means 31**.

The tank 17 is also shown resting on resilient shock absorbing means, such as pads 152, 153. The cut-away section of the tank shows the heater 34 clamped to the tank by means such as clamps 36, 37. In a preferred embodiment, the heater is quartz sheathed. It should be noted that the heater is almost fully immersed in the etchant fluid 33.

Also visible in FIGS. 3 is the heat sensor 39. Both the heater and the heat sensor are coupled to the control panel. The heater is connected through cable 38. The heater is used to preheat the etchant and the heat sensor notifies the control unit when the etchant is within the proper operating temperature range.

An explanation of FIG. 11 will help understand the complete operation of the automatic etching equipment. Means such as power plug 154 are provided for connecting the inventive equipment to a source of electrical power, such as 110 volts AC. The power plug 154 is coupled to positions *x* and *y* of socket 156 through conductors L1, L2, respectively. A pair of spare AC receptacles 157 are provided. The female socket receptacles *m* are connected to socket 156 "2" position through conductor P1. As is obvious in FIG. 11, the electrical connectors described to this point are all located in the mobile cart or base 11.

A plug 158 and associated conductors L1, L2, P1 connect the control housing 18 to the power source when plug 158 is inserted into socket 156. Conductors L1, L2 associated with plug 158 carry power to socket 159 of the control housing. The same position designations are used on the plugs and sockets connected to the same sources throughout FIG. 11. The control panel or housing contains thermostat 43 and timer 42. The thermostat has two terminals. Terminal 1 of thermostat 43 is coupled to lead L1 while terminal 2 of the thermostat is coupled to lead P1, to position 2 of socket 159, and to terminal T1 of timer 42, via line 161.

The timer 42 has three terminals T1, T2 and T3. Terminal T2 is tied to the common wiper or armature of a single pole double throw timed switch. Terminal T2 is normally connected to terminal T3. When the timer is cycled to set, terminal T2 is connected to terminal T1 until the expiration of the allotted time. Thus, only when the timer is set can the thermostat be energized.

The energization circuit of thermostat 43 extends through conductor L1 to terminal 1, through the thermostat 43 to thermostat terminal 2, over conductor 161 to timer terminal T1, timer terminal T2, over conductor 162 to socket 159, position *u*. As will be described in detail further in the specification, position *u* is connected through the master switch to line L2. Thus the timer when set is in series in the operate circuit for the thermostat (heater) and the energization circuit for conductor P1.

Plug 164 and its associated cabling electrically couples the chain drive housing assembly to the control housing. Position *y* of plug 164 is coupled to the armature terminal or wiper terminal M1 of master switch 166. The master switch 166 is shown as a double pole, double throw switch that has switch positions, "Off," "Power" and "Drive." It should be understood that while schematically the master switch 166 is shown as a double pole double throw switch, thus showing is only for convenience. The motor switch could also be rotary switch for example. Also, the master switch is shown in the drive housing only for convenience. Any of the controls can be just as easily located in another section of the automatic equipment.

In "Off" position armature terminals M1, M2 of master switch 166 are not in contact with any other terminals. The top power terminal of switch 166 is connected through conductor 167 to position *u* of plug 164, and also to one side of the inspection light 83. The other side of light 83 is connected through conductor L1 to position *x* of plug 164. Conductor L1 also extends to one side of motor M and to terminal F1 of flasher unit 168. Both poles of the armature of switch 166 are connected to conductor L2 through armature terminals M1, M2. The bottom powei terminal of switch 166 is not connected to anything.

The top drive terminal of master switch 166 is connected to the normally closed terminal NC of microswitch 61 over conductor 169. The bottom drive terminal of switch 166 is connected to conductor 167. This connection retains power on the spray pump (AC receptacle) through conductor P1 inspection light and thermostat, when the switch 166 is in the "Drive" position and the timer is set.

The common terminal C of switch 61 is connected to the other side of drive motor 66 over conductor 171. The normally open terminal, which is closed when pressure is applied to lever 64, is connected to position *w* of plug 164 over conductor 172.

Position 2 of plug 164 is connected to terminal F2 of flasher unit 168 over conductor 173. Conductor 173 also is connected to one side of wink light 48. The other side of wink light 48 is connected to terminal F3 of flasher unit 168. The flasher unit can be any well known thermally operated unit, comprising a pole, double throw switch. Thus terminal F1 is normally connected to terminal F2. When there is a complete circuit and power goes through conductor 173 a bimetal strip in flasher unit 168 switches to open the connection between terminal F1 and F2 and closes the connection between terminal F1 and F3. This turns on the light. When the thermal unit cools, the normal connection is restored and the light is deenergized once again. Conductor 173 is energized when the master switch is on and the timer is off.

When the master switch is turned to the power position, current is supplied to the inspection lamp 83 over a circuit that extends from the power plug 154 over lead or conductor L1 coupled through sockets and plugs 156, 168, 159, and 154 to one side of lamp 83, through lamp or light 83, lead 167, top wiper of master switch 166, conductor L2, and through the plugs and sockets 164, 159, 158, 156 to power plug 154.

With the master switch in the power position, power is also available to the timer terminal T2 over a circuit that extends from line L2, through master switch 166, conductor 167, position *u* of plug 164, socket 159 and conductor 162 to terminal T2 of the timer.

When the timer is in its normally unset position, such as at the completion of the cycle, terminal T2 is connected to terminal T3. Terminal T3 is connected to socket 159 position 2, through wink light 48, flasher terminals F3, F1 to line L1, thus completing the wink light circuit to operate the wink light 48.

When the timer is set then conductor P1 is connected to conductor L2 through conductor 161 to timer terminals T1, T2, position *u* of socket 159, position *u* of plug 164, conductor 167, and master switch 166 to conductor L2. When this occurs, power is supplied to AC receptacle 157. Pump 26 (not shown in full) receives electrical power from AC receptacle 157. Thus, setting the timer with the master switch set to the "Power" position causes the pump to operate and the etchant to be sprayed.

At the same time, the thermostat 43 is energized over conductor 161. The energization of thermostat 43 energizes the heating element 34 (not shown in FIG. 11). The heating element remains energized until the etchant temperature reaches that set on the thermostat (100° F. when ammonium persulfate is used). The temperature is, of course, detected by the heat sensor 39 (not shown in FIG. 11), which automatically controls the thermostat to deenergize the heater when the temperature rises above the desired temperature, and to reenergize the heater when the temperature falls below the desired temperature.

When master switch 166 is set to its "Drive" position, chain drive motor 66 is energized over the top wiper M, of switch 166, driving the work-loaded chain around on its cycle. The energization of motor 66 occurs over a circuit that extends through microswitch 61 in its normally closed position. It should be noted that even if the microswitch is operated to connect the normally open terminal to the common terminal while the timer is set, the motor will continue to operate over circuit that extends from L1 through motor 66, conductor 171, terminal C of switch 61, terminal NO of switch 61, conductor 172, position *w* of plug and socket 164, 159, conductor 161, timer 42, conductor 162, position *u* of socket 159, plug 164, conductor 167, lower wiper M2 of switch 166 to conductor L2. When the timer 42 is not set then operation of microswitch 61 while switch 166 is in the "Drive" positon, stops motor M. When the timer is not set, conductor P1 and consequently AC receptacle 117 is deenergized regardless of the state of microswitch 61. Therefore, unless the timer is set, no power is delivered to the heater or to the pump.

When the drive-motor is energized, the workpiece is carried through a complete cycle approximately every seven seconds. The workpiece is removed from the path of the exothermic etchant during every cycle and thus has a chance to cool down. The complete etching process preferably takes in the order of ten minutes, or approximately 87 cycles.

In operation, the tank is supplied with an exothermic etchant fluid such as ammonium persulphate. The operator then turns the master switch to the power position. The thermostat is set for the desired operating temperature and the timer is set for thirty minutes.

When the etchant is at the proper operating temperature the printed circuit board hanger is placed over the dog located on the drive chain. A board to be processed is clamped into place in the clamp of the hanger. This clamping is accomplished by turning the handle of the clamp wringer-tight. The timer is again set. This timer is set for approximately one-half the complete etching time required.

With the master switch on "Power" and the timer set, the thermostat, the inspection light, and the pump operate. The master switch is now turned to the "Drive" posiion, energizing the drive chain motor. The board is lowered into the uniform gentle etchant spray and returned to its starting point once every seven seconds. Thus the board is exposed to air during every seven second cycle and accordingly cooled automatically.

When the timer turns off at the end of its set period, the pump and thermostat are deenergized. The motor continues to run until the hanger abuts the microswitch operating lever opening the operating path of the motor and closing the operating path of the flasher. Responsive to the energization of the flasher the wing light flashes to signal the operator. The operator opens the outwardly biased clamp, removes the board, turns it upside down, and reclamps the board. The timer is reset and the process is repeated. At all times, the inspection light is lit and the visual inspection of the board can take place.

The spraying arrangement, wherein a gentle uniform spray is used rather than a high pressure spray, and the cycling self-cooling process combine to repeatedly, reliably provide boards having a high degree of precise fine line resolution.

The adverse exothermic effects of efficient etchants, such as ammonium persulfates, is counteracted by the equipment described herein. No cooling devices are required. The boards are continually air cooled. The wide spray area, which is only partially enclosed, enables the convective dissipation of excess heat from both the spray and the entire board surface.

While the principles and process of the invention have been described in connection with specific apparatus, it is to be clearly understood that this description is made only by way of example and not as a limitation on the scope of the invention.

Accordingly, what is claimed is:

1. Automatic etching equipment for etching workpieces, such as in process printed circuit boards, said equipment comprising tank means for holding a supply of etchant, spray assembly means coupled to said tank means for directing a spray of etchant liquid, drive means for automatically repeatedly inserting and removing said workpiece into and out of said spray during an etching operation, drive control means for controlling said drive means to remove said workpiece from said spray after the termination of an etching operation, means included in said drive control means for automatically turning off said spray at the termination of said etching operation said drive means comprises drive chain assembly means having a pair of sprocket wheels, drive chains means virtically extended between said sprocket wheels, motor means for driving at least one of said sprocket wheels, dog means attached to said drive chain, extension means supporting said drive chain means over said spray, and means for attaching said workpieces to said dog means whereby when said one sprocket wheel is driven, said workpiece will be raised and lowered into and out of said spray.

2. The etching equipment of claim 1, wherein said means for attaching said workpieces to said dog means comprises hanger clamp assembly means, said hanger clamp assembly means having a slotted hole at one end for fitting onto said dog means, and clamp means at the other end thereof for holding said workpieces.

3. The etching equipment of claim 2, wherein said drive control means comprises microswitch means, actuating lever means on said microswitch means mounted to operate said microswitch when abutted by said hanger clamp as said hanger clamp approaches the upper sprocket wheel, and means responsive to the operation of said microswitch for deenergizing said motor means to stop said drive means.

4. The etching equipment of claim 3, wherein said means for automatically turning off said spray comprises timer means for removing power from said spray directing means at the end of a certain preset time period, bypass means including said timer means for energizing said motor means when the microswitch is operated during said certain preset time period.

5. The automatic etching equipment of claim 3, including heating means for automatically heating said etchant to a desired temperature.

6. The automatic etching equipment of claim 5, wherein said heating means comprises immersion heater means, means for supporting said immersion heater within the etchant in the tank, sensor means for continuously monitoring the temperature of the etchant within said tank, and thermostat means for connecting said heater to power when the monitored temperature within the tank is below that set on the thermostat and for disconnecting said power when the monitored temperature is above that set on the thermostat.

7. The automatic etching equipment of claim 6 and means for connecting power to the thermostat means through said timer means whereby power is delivered to said heater only when the timer is set.

8. The etching equipment of claim 3 including guide means mounted on said lower porch for guiding said hanger clamp, said guide means comprising three guide surfaces arranged so that at least two surfaces are continually in contiguous relationship with said hanger clamp during said etching operation.

9. The automatic etching equipment of claim 3 including wink light means for signaling the termination of said etching operation, said wink light means including flashing means for providing a winking light when energized, and means for energizing said wink light responsive to the operation of the timer at the end of said certain preset period.

10. The automatic etching equipment of claim 3, including an inspection light, means for energizing said inspection light when power is switched on to commence the etching operation.

11. The etching equipment of claim 2, for use in handling workpieces such as in process printed circuit boards, said hanger clamp assembly comprising a control hanger section, clamp jaw means, resilient means firmly fixed to said central hanger section and to said jaws for outwardly biasing said clamp jaws and means for applying inward forces to push said jaws together against said outward bias.

12. The etching equipment of claim 11, wherein said clamp jaws comprise a pair of L-shaped sections, and means for fixing said resilient means into the top vertical portions of said sections whereby said sections are arranged with the horizontal portions of the L-section in opposition.

13. The etching equipment of claim 11, wherein said inward force applying means comprises a threaded clamping bolt, said bolt having handling means at one end thereof, a threaded hole in one of said jaws, insertion holes in said hanger section and the other of said jaws, and washer means that are an integral part of said bolt located between the threaded portion of said bolt and said handle means whereby, when said bolt is inserted through said insertion holes and threaded into said threaded hole, said washer abuts one of said jaws forcing said jaws together against the outward bias.

14. The etching equipment of claim 1, wherein said drive chain assembly means comprises chain-adjusting means for adjusting the inclination and tautness of said vertically extended chain means.

15. The etching equipment of claim 14, wherein said drive chain assembly means comprises a standard extending above said spray, said extension means comprises an upper porch and a lower porch attached to said standard and extending out over said spray, rod means reaching from said standard through said upper porch for attaching one of said sprocket wheels at the front of said upper porch, and wherein said chain adjusting means comprises means for varying the effective length of said rod means to move said attached sprocket wheel closer or further from the front of said upper porch along a line inclined to said horizontal.

16. The etching equipment of claim 15, wherein said rod means is threaded at one end, first apertures in the upper porch and standard at the junction therebetween, a second aperture at the front of said upper porch, said second aperture being vertically aligned with and higher than said first apertures, said rod extending through said first aperture and second aperture with said threaded end at said first apertures, a pair of nuts threaded onto said rod with one nut on each side of said first apertures for readily adjusting the effective length of said rod.

17. The etching equipment of claim 1, wherein said means for automatically turning off said spray comprises timer means for removing power from said spray directing means at the end of a certain preset time period.

18. The automatic etching equipment of claim 1, wherein said spray assembly means comprises pipe means, means for supporting said pipe means, pump means for pumping said etchant from said tank to said pipe means, and orifice means extending the length of said pipe means for providing a gentle uniform spray normal to said workpieces as they are raised and lowered past said orifices.

19. The automatic etching equipment of claim 18, wherein said pipe means comprises at least a pair of pipes that are disposed to have said workpiece raised and lowered therebetween to receive a gentle normal spray of said etchant at opposite sides thereof.

20. The automatic etching equipment of claim 19, wherein splash housing means are provided for surrounding said pipe means, slot means at the top of said splash housing for enclosing the passage of said workpieces, shoulder means at the top of said tank means for receiving said splash housing means, and guide means within said splash housing for dampening vibratory and transverse movement of said workpiece.

21. The equipment of claim 19, including dust cover means fitted to said slot for covering said splash housing and tank not when in use.

References Cited

UNITED STATES PATENTS

| | | | |
|---|---|---|---|
| 1,145,183 | 7/1915 | Burger | 134—164 |
| 1,254,751 | 1/1918 | Wendelgass | 134—164 |
| 1,266,167 | 5/1918 | Sears | 134—151 XR |
| 1,808,906 | 6/1931 | Powers | 134—194 XR |
| 1,839,511 | 1/1932 | Townsend | 134—164 |
| 2,293,201 | 8/1942 | Gaebel | 134—194 XR |
| 2,725,063 | 11/1955 | Huffman | 134—153 XR |
| 2,827,724 | 3/1958 | Edds | 134—57 XR |
| 2,894,519 | 7/1959 | Gregg | 134—160 XR |
| 3,101,088 | 8/1963 | Gray | 134—151 |
| 3,323,528 | 6/1967 | Link | 134—199 XR |

FOREIGN PATENTS

| | | |
|---|---|---|
| 1,187,866 | 9/1959 | France. |

ROBERT L. BLEUTGE, *Primary Examiner.*